United States Patent [19]

Okado

[11] Patent Number: 5,123,746
[45] Date of Patent: Jun. 23, 1992

[54] BRIDGE TYPE POWER CONVERTER WITH IMPROVED EFFICIENCY

[75] Inventor: Chihiro Okado, Fuchu, Japan

[73] Assignee: Kabushiki Kaisha Toshiba, Kawasaki, Japan

[21] Appl. No.: 619,917

[22] Filed: Nov. 30, 1990

[30] Foreign Application Priority Data

Dec. 4, 1989 [JP] Japan .................................. 1-313290
Jan. 16, 1990 [JP] Japan .................................. 2-4515

[51] Int. Cl.$^5$ .......................................... H02M 5/458
[52] U.S. Cl. ........................................ 363/37; 363/56; 363/98
[58] Field of Search ................... 363/17, 35, 37, 50, 363/51, 56, 98, 132, 136

[56] References Cited

U.S. PATENT DOCUMENTS

| | | | |
|---|---|---|---|
| 4,489,371 | 12/1984 | Kernick | 363/98 |
| 4,566,059 | 1/1986 | Gallios et al. | 363/56 |
| 4,777,578 | 10/1988 | Jahns | 363/98 |
| 4,788,635 | 11/1988 | Heinrich | 363/37 |
| 4,853,832 | 8/1989 | Stuart | 363/56 |

FOREIGN PATENT DOCUMENTS 0050753 5/1982 European Pat. Off. .

OTHER PUBLICATIONS

"New Drive Electronics", Modern Technology Series, p. 76.
"MOS-Controlled Thyristor Turns Off 1 MW IN 2 μS" by Frank Goodenough, p. 57, 58, 60, 63, 64 and 66.

*Primary Examiner*—Peter S. Wong
*Attorney, Agent, or Firm*—Oblon, Spivak, McClelland, Maier & Neustadt

[57] ABSTRACT

In a bridge type power converter, one of series-connected semiconductor elements of an inverter bridge is constituted by an MCT having a low-loss characteristic, or substantially constant-voltage characteristic, with a small voltage drop under conduction, and the other semiconductor element is constituted by an IGBT having a constant-current characteristic with a current suppressed in accordance with a drive signal. A failure current is suppressed by a current-suppressing effect of the IGBT and safely interrupted by turning off the MCT and the IGBT.

11 Claims, 10 Drawing Sheets

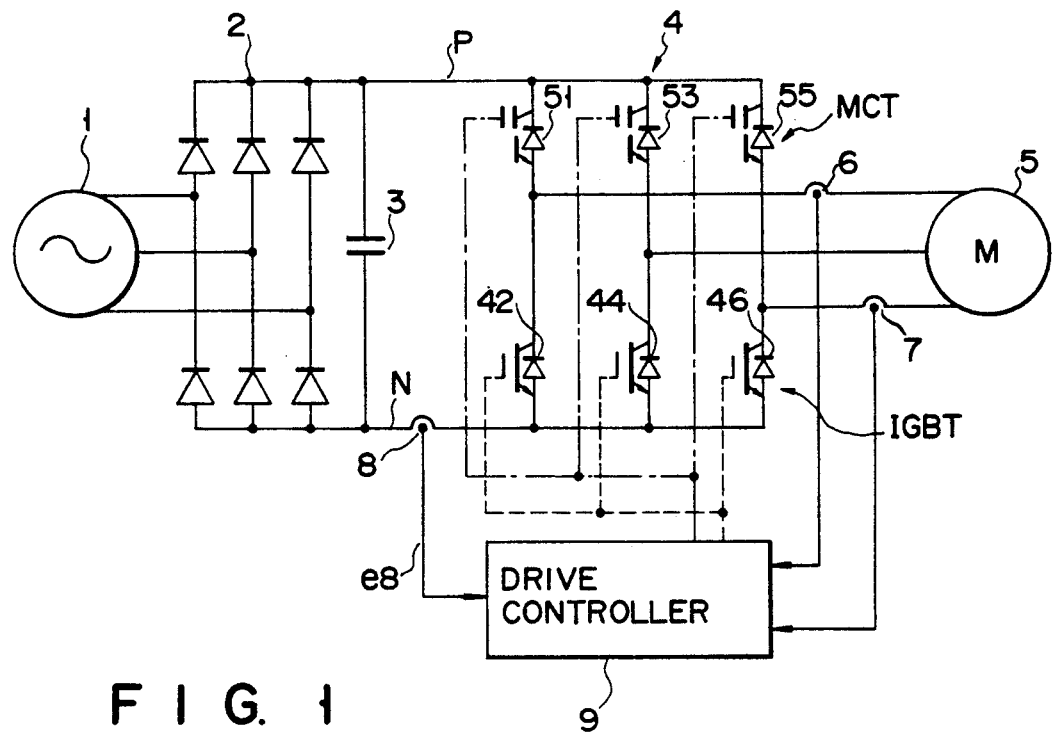
F I G. 1
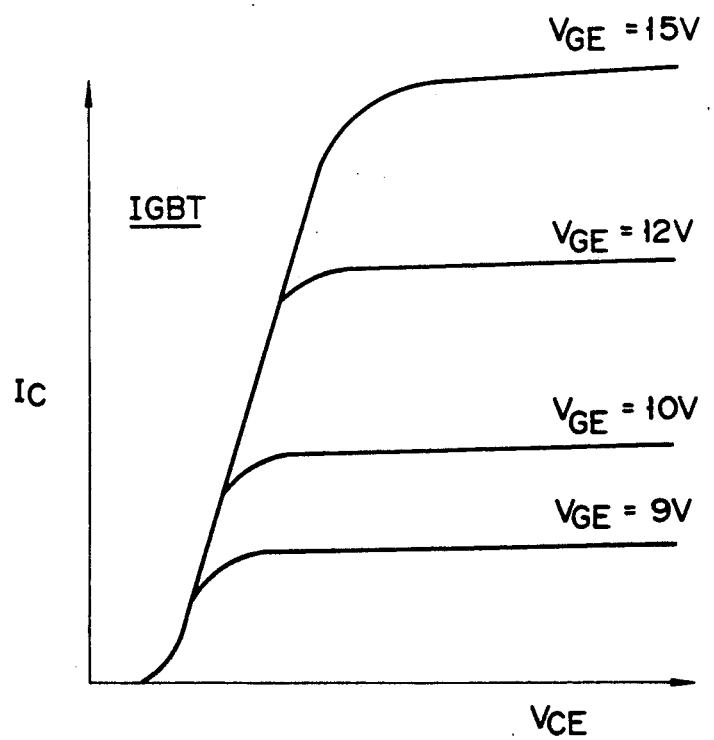
F I G. 2

F I G. 3A
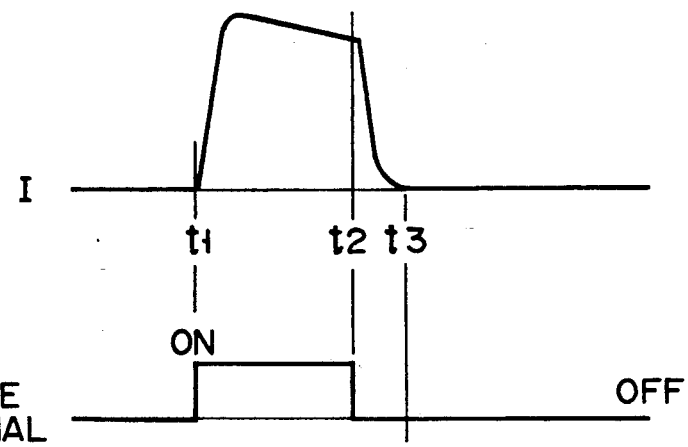
F I G. 3B DRIVE SIGNAL
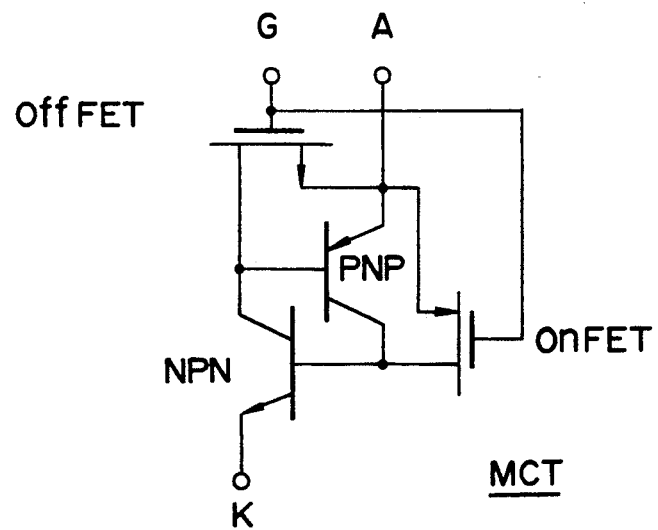
F I G. 4

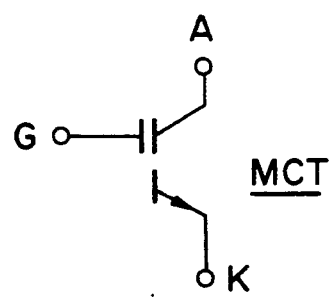
F I G. 5
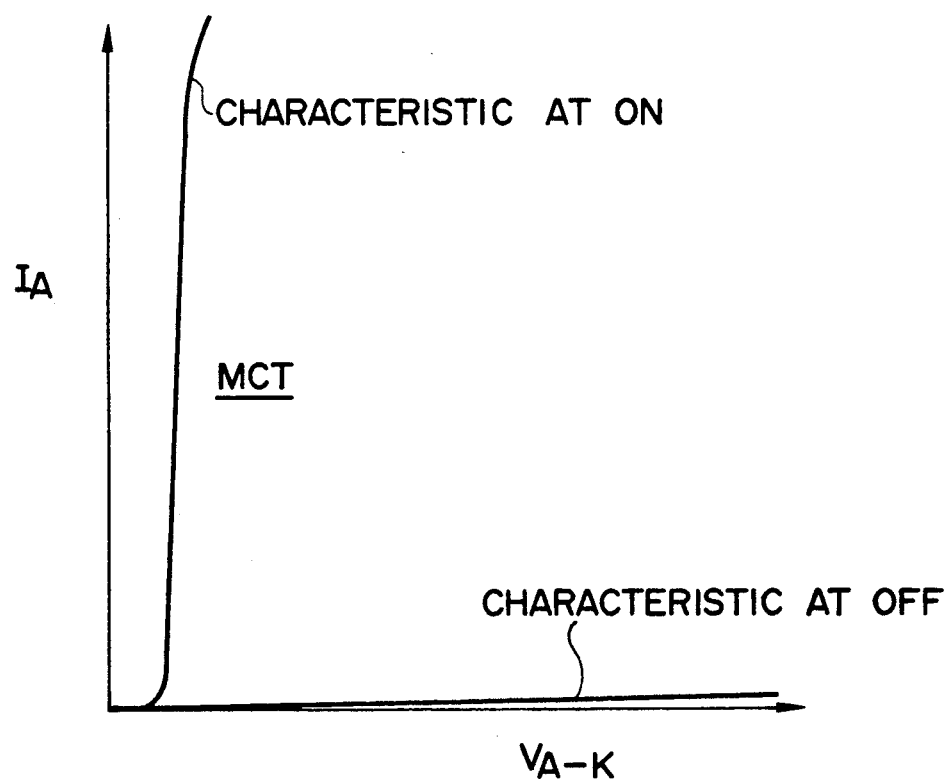
F I G. 6

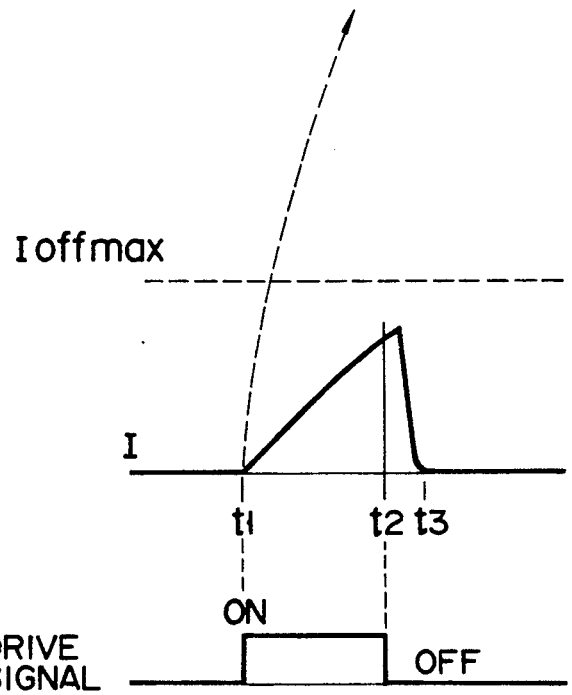
FIG. 7A
FIG. 7B
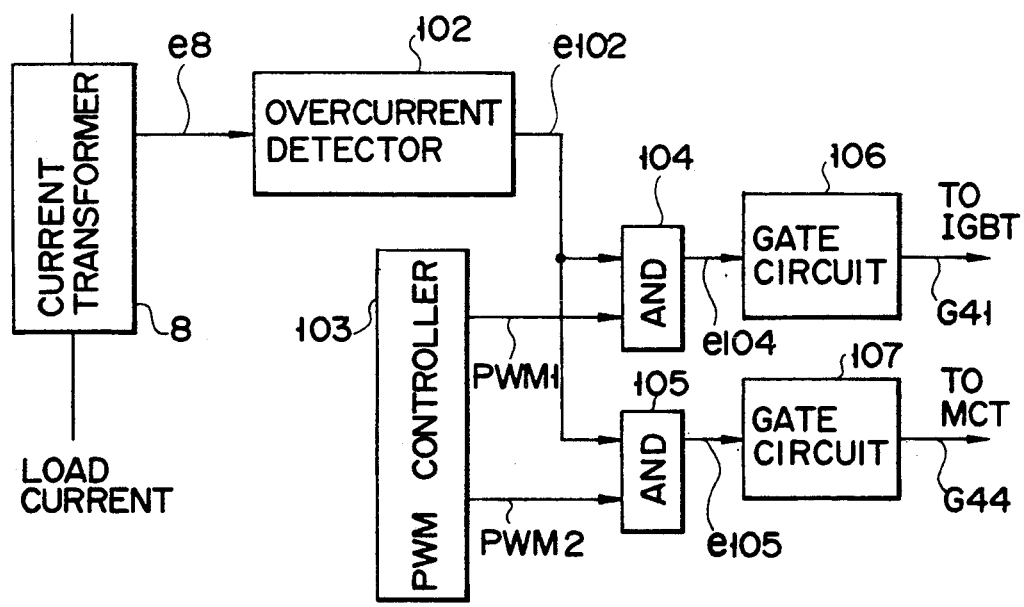
FIG. 8

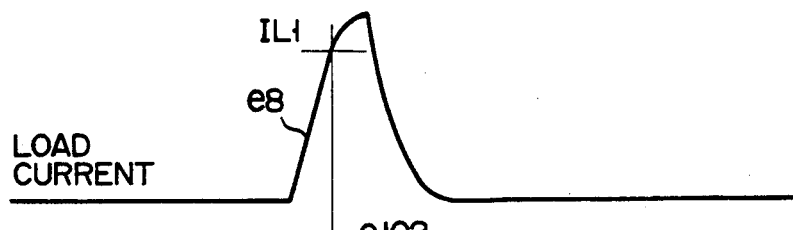
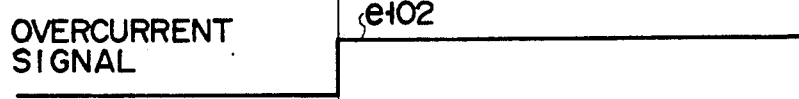
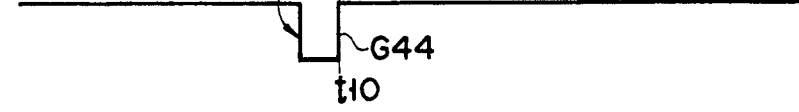
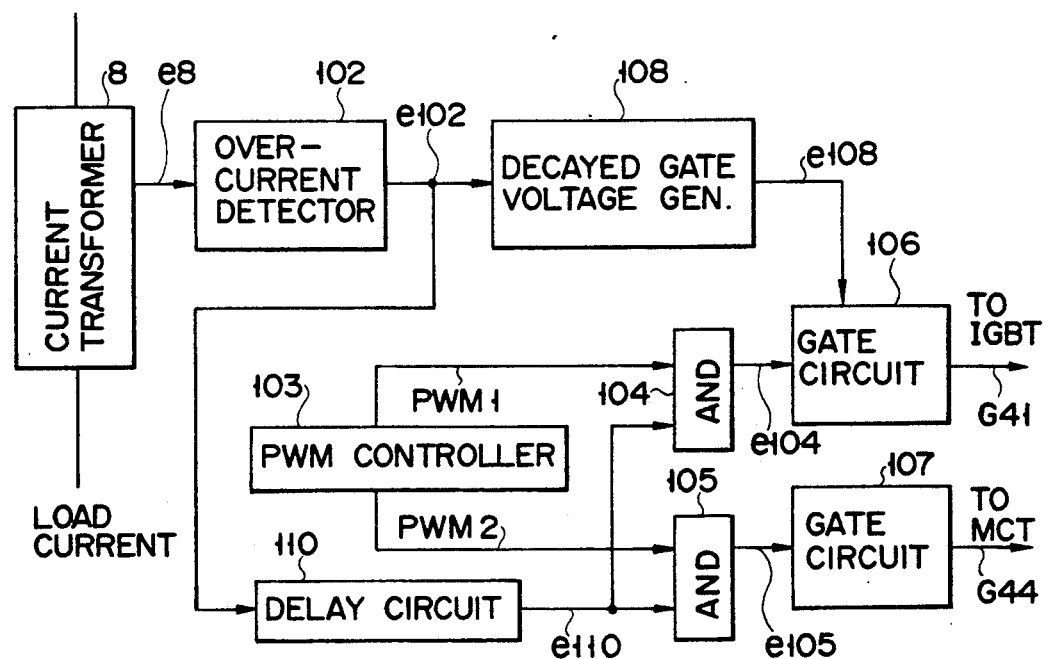
F I G. 10

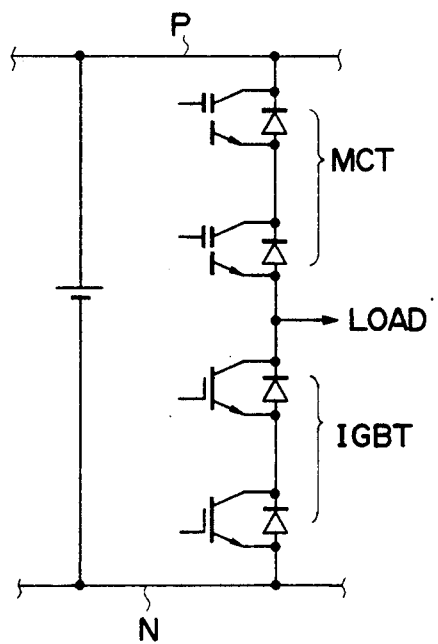
F I G. 16
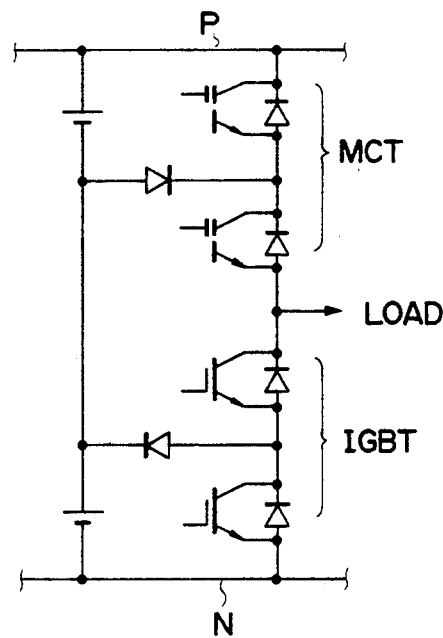
F I G. 17
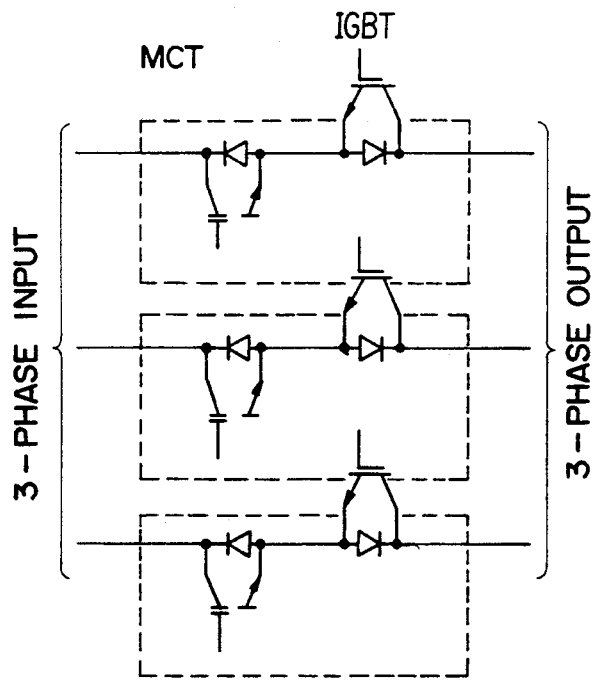
F I G. 18
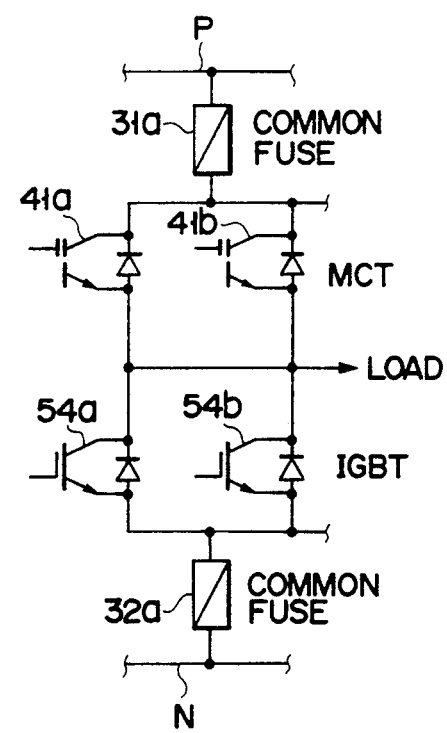
F I G. 19

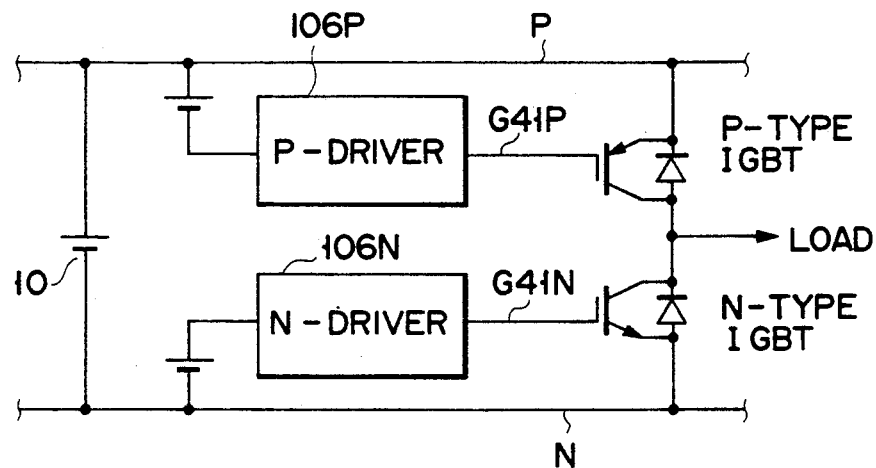
FIG. 20
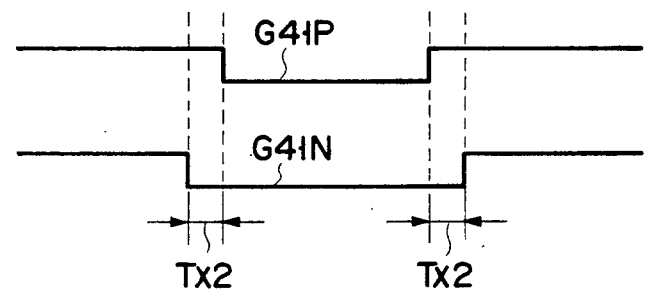
FIG. 21A
FIG. 21B
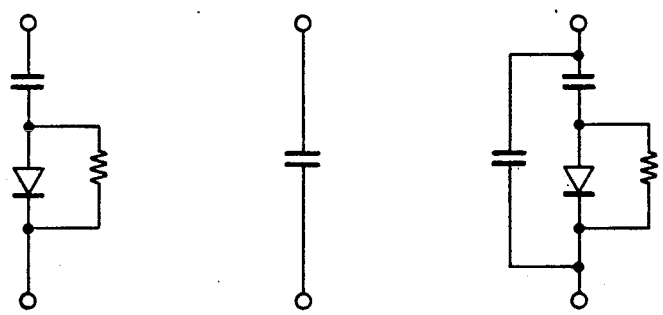
FIG. 22A    FIG. 22B    FIG. 22C

BRIDGE TYPE POWER CONVERTER WITH IMPROVED EFFICIENCY

BACKGROUND OF THE INVENTION

1. Field of the Invention

The present invention relates to a bridge type power converter using a self turn-off element and having improved driving and protecting characteristics.

2. Description of the Related Art

An IGBT (Insulated Gate Bipolar Transistor) is often used as a switching element of an inverter bridge of a voltage type inverter formed of transistors.

FIG. 2 shows $V_{CE}$ (collector-emitter voltage) vs. $I_C$ (collector current) characteristics using a drive voltage $V_{GE}$ (gate-emitter voltage) of the IGBT as a parameter. A characteristic feature of a transistor type power element is that collector current $I_C$ becomes substantially constant when collector-emitter voltage $V_{CE}$ exceeds a predetermined value. In other words, this transistor type power element has a constant-current characteristic.

The transistor type power element, however, has comparatively high voltage $V_{CE}$ with respect to a given constant current $I_C$, i.e., has a high DC resistance.

A switching element of this inverter bridge can be constituted by an MCT (MOS Controlled Thyristor). In this case, a reactor for suppressing a current increase rate is connected between a DC power source and the inverter bridge, and a high-speed diode for suppressing a surge voltage generated by the reactor is connected therebetween in parallel with the reactor.

The MCT has a thyristor structure constituted by PNP and NPN transistors as shown in FIG. 4. When an ON FET is turned on by a gate signal, the NPN transistor is turned on, and the PNP transistor is turned on. Therefore, the MCT is self-held to perform an operation equivalent to that of a thyristor and exhibits a low voltage drop characteristic between the anode and cathode. When an OFF FET is turned on by the gate signal, the base-emitter path of the PNP transistor is short-circuited to turn off the PNP transistor, and the NPN transistor is turned off, thereby stopping the thyristor operation. FIG. 5 shows a circuit symbol of the MCT.

FIG. 6 shows anode current $I_A$ vs. anode-cathode voltage $V_{A-K}$ characteristics of the MCT. As shown in FIG. 7, almost no current flows when the MCT is OFF, and a voltage drop exhibits a low value when the MCT is turned on. In addition, unlike a transistor type element, the MCT has no constant-current characteristic and therefore can be considered as a low resistance resistor when it is turned on.

In a voltage type inverter using a transistor type element as a switching element of an inverter bridge, if terminals of a load motor are short-circuited or the motor causes a layer short-circuit, a protection operation is performed as shown in FIGS. 3A and 3B. That is, after the transistor is turned on at time $t_1$ (FIG. 3B), an overcurrent is detected at a time $t_2$ (FIG. 3A) to turn off a drive signal, thereby safely shutting off a failure current suppressed by a constant-current characteristic of the transistor till time $t_3$ (FIG. 3A).

Since, however, the transistor type element has a large voltage drop in $V_{CE}$ for a large $I_C$ (i.e., a DC resistance is high) as shown in FIG. 2, a power loss in an inverter portion is large to result in a low efficiency.

Although voltage drop $V_{AK}$ of a thyristor type element such as an MCT is small even if a large $I_A$ flows, the element has no current-suppressing effect (constant-current characteristic). Therefore, a reactor is inserted in the DC circuit of an inverter to suppress a rate of increase in the magnitude of a current, and a drive signal is turned off before the current is excessively increased. This operation is shown in FIGS. 7A and 7B. Maximum current $Ioff_{max}$ which is the upper limit of ensuring a turn-off operation is present in the MCT, and the MCT must be turned off by this maximum current or less.

When a reactor is not used, a current obtained when the terminals of a motor are short-circuited is as indicated by a broken line in FIG. 7A. In this case, since a current rapidly rises, the MCT cannot be turned off before current $Ioff_{max}$ is reached.

When a reactor is inserted, the leading edge of the current is suppressed as indicated by a solid line in FIG. 7A. Therefore, if the drive signal is turned off at time $t_2$ (FIG. 7B), the current can be set to be zero at time $t_3$ (FIG. 7A).

Although the MCT has a high efficiency because a voltage drop is small when it is turned on, it requires a reactor and a high-speed diode for suppressing a surge voltage. In addition, since the reactor must have a large capacity so as not to be saturated even with an overcurrent, an inverter having a small or middle capacity cannot be economically designed.

Meanwhile a main circuit and a driver of a voltage type inverter generally use as an inverter bridge element an IGBT and a self-extinguishing element such as a MOSFET, a bipolar transistor, and an MCT. For example, the circuit is arranged such that a DC power output is supplied to a transistor bridge via a high-speed fuse, the DC power is converted into AC power by a switching operation of the bridge, and the converted power is supplied to a load.

The above transistor bridge constitutes a 3-phase bridge by IGBTs. Each IGBT on the positive side is driven by supplying a drive signal from an individual drive power source to the gate of the IGBT. On the other hand, since the emitters of IGBTs on the negative side are commonly connected, a gate drive signal can be supplied from a common drive power source to the gates of the IGBTs.

When a power capacity of the inverter is increased, a current of each IGBT on the negative side is increased to increase a voltage drop in the wiring commonly connecting the emitters (assuming that if an inductance of the wire is L, a voltage of Ldi/dt (where i is the current and t is the time) is generated when current i is changed). In this case, if a drive power source is commonly used, noise of L(di/dt) is applied to the gates of the other IGBTs to cause an erroneous operation. Thus, three drive power sources must be used for the elements on the negative side similar to the elements on the positive side, i.e., a total of six drive power sources must be used.

In addition, most of currently used transistors are elements called a module type in which a main electrode and a cooling surface are electrically insulated and a transistor chip in the module is connected to an electrode outside the module through a bonding wire. When a transistor connected to the positive and negative sides is broken (deteriorated) to short-circuit the positive and negative terminals of a DC power source, an overcurrent flows through the transistor to fuse the bonding wire in the module. As a result, an arc is generated to dangerously scatter the outer wall of the module type transistor. Therefore, a high-speed fuse is used to interrupt a failure current.

When the capacity of an inverter is increased, a large number of parallel module elements must be used. In this case, in order to prevent a rupture of the outer wall of the module element, a high-speed fuse is connected to the collector of each IGBT because it is practically difficult to obtain a common fuse suited to protect the individual module elements connected in parallel with each other. In addition, the fuse is connected to the collector of each IGBT because a gate drive signal of the IGBT must be commonly applied to the emitter and the gate of the IGBT.

In the circuit having the above arrangement, since at least four, and preferably, six semiconductor element drive power sources must be used in the case of a 3-phase inverter, the circuit is complicated to result in an economical disadvantage.

In addition, if an arrangement in which a fuse is connected to the collector of each IGBT is adopted, a wire length for the fuse is increased to increase an inductance (L) and an inductance of the fuse itself. As a result, a surge voltage ($-Ldi/dt$) to be applied to the IGBT upon turning off is increased to degrade the reliability of the IGBT element.

Especially in an element having a high switching speed, a rate (di/dt) of change in a switching current is increased to a value several times that of a conventional bipolar transistor, and a surge voltage is increased accordingly. Therefore, a conventional circuit arrangement cannot be practically adopted.

In order to absorb this surge voltage, a surge energy between the connector and the emitter of an IGBT may be clamped by a series circuit of a capacitor and a diode, and the clamped energy is then discharged via a resistor.

In this circuit, however, the number of constituting elements is increased to complicate the circuit arrangement, and a surge clamp circuit must be provided for each of IGBTs connected in parallel with each other. In addition, an energy loss is produced in the resistor through which a discharge current of the clamped energy flows, thereby decreasing an efficiency.

SUMMARY OF THE INVENTION

It is an object of the present invention to provide a bridge type power converter which solves the above problems, i.e., has a high efficiency and is compact and economical.

In order to achieve the above objects, in a bridge type power converter of the present invention, one of series-connected semiconductor elements in the inverter bridge is constituted by a first self-extinguishing switching element such as an MCT having a low-loss characteristic (substantially constant-voltage characteristic) with a small voltage drop under conduction, and the other semiconductor element is constituted by a second self-extinguishing switching element such as an IGBT having a constant-current characteristic with a current suppressed in accordance with a drive signal. A failure current is suppressed by a current-suppressing effect of the second self-extinguishing switching element and safely interrupted by turning off the first and second self-extinguishing switching elements In a bridge circuit of the present invention, the emitter of the IGBT which is turned on/off by a drive signal supplied between the emitter and the gate, and the anode of the MCT which is turned on/off by a drive signal supplied between the anode and the gate are connected to be used as an output terminal; the collector of the IGBT is connected to the positive side of a DC bus via a fuse; the cathode of the MCT is connected to the negative side of the DC bus via a fuse; and a snubber circuit is connected between the collector of the IGBT and the cathode of the MCT. In this arrangement, a common drive power source is used for the IGBTs, and a common drive power source is used for the MCTs.

Since the connector of the IGBT and the cathode of the MCT are connected from the DC power source via the fuses, a snubber capacitor is connected between the collector and the cathode to absorb a surge energy caused by an inductance of the fuse circuit, thereby preventing the surge voltage from being applied to the elements (IGBT and MCT).

In addition, since the emitters of the IGBTs and the anodes of the MCTs are commonly connected, the IGBTs and the MCTs can be driven by common drive power sources, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram of a bridge type power converter according to an embodiment of the present invention;

FIG. 2 is a typical $I_C$-$V_{CE}$ characteristic of an IGBT;

FIGS. 3A and 3B are waveform diagrams explaining a protection operation for a transistor (IGBT) inverter;

FIG. 4 shows an equivalent circuit of an MCT;

FIG. 5 shows a circuit symbol of the MCT

FIG. 6 is a typical $I_A$-$V_{AK}$ characteristic of the MCT;

FIGS. 7A and 7B are waveform diagrams explaining a protection operation for a thyristor (MCT) inverter;

FIG. 8 is a block diagram showing a configuration of the drive controller in FIG. 1;

FIGS. 9A to 9F are waveforms illustrating an operation of the drive controller in FIG. 8;

FIG. 10 is a block diagram showing a configuration of the drive controller in FIG. 1;

FIG. 16 shows an example of one arm of an inverter bridge which can be used for the power converter in FIG. 1;

FIG. 17 shows another example of one arm of an inverter bridge which can be used for the power converter in FIG. 1;

FIG. 18 shows still an example of a 3-phase AC switch which can be applied to the power converter in FIG. 1;

FIG. 19 shows a partial modification of the inverter in FIG. 12;

FIG. 20 is a circuit diagram of a complementary IGBT inverter according to still another embodiment of the present invention;

FIGS. 21A and 21B are waveforms of signals used for driving the complementary IGBT's in FIG. 20; and FIGS. 22A to 22C show various type of snubber circuits which can be used for the embodiment of FIG. 12.

DETAILED DESCRIPTION OF THE PREFERRED EMBODIMENT

Figure 11:
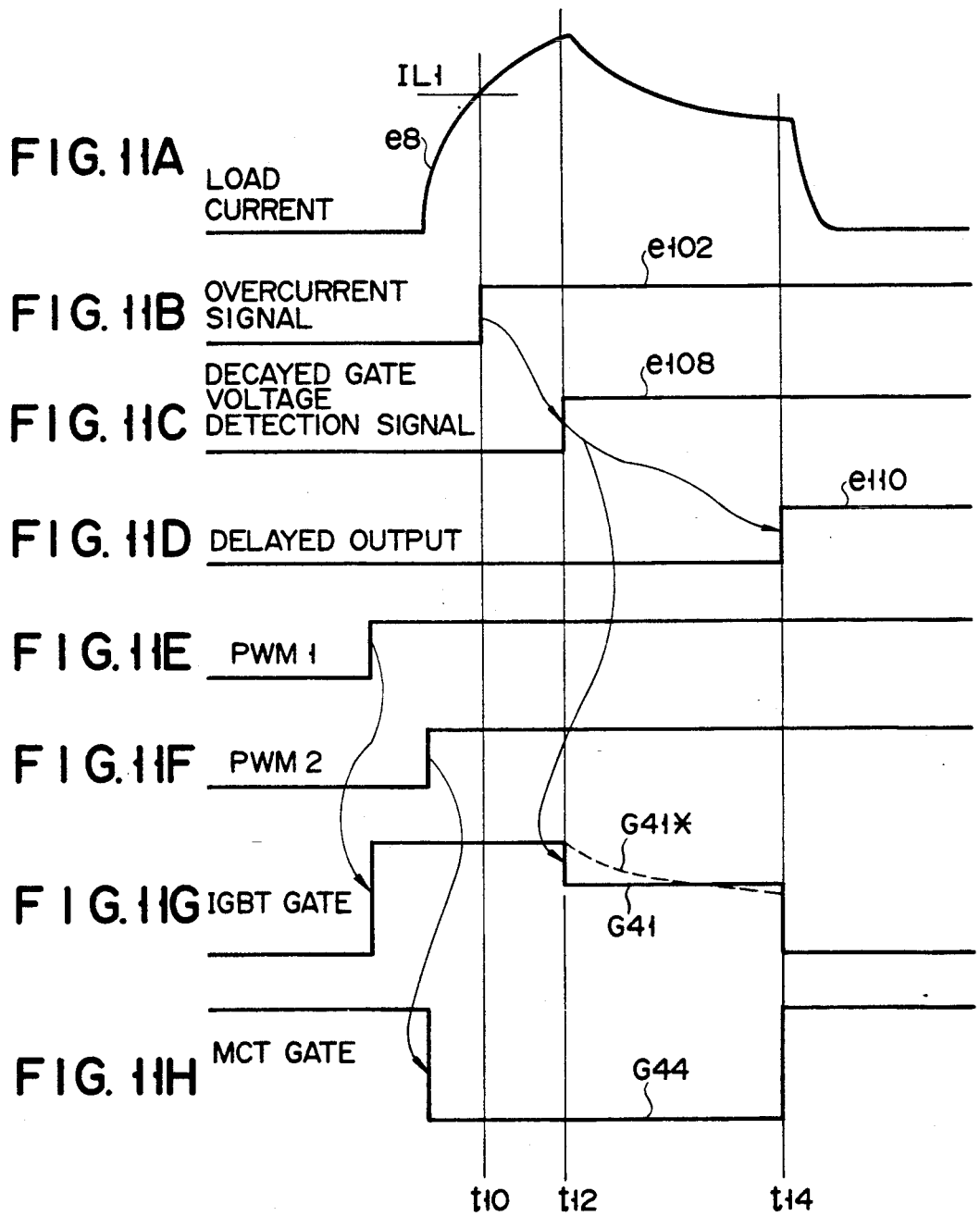
FIGS. 11A to 11H are waveforms illustrating an operation of the drive controller in FIG. 10.

As an embodiment of the present invention, a main circuit and protection of a voltage type inverter using transistors will be described below with reference to FIG. 1.

An AC voltage from AC power source 1 is converted into a DC voltage by diode bridge 2 and smoothed by capacitor 3. This DC voltage is converted into a second AC voltage by inverter bridge 4 and supplied to load motor 5. MCTs 51, 53, and 55 are connected to positive DC bus P of inverter bridge 4, and IGBTs 42, 44, and 46 are connected to its negative DC bus N.

A load current is detected by current detectors 6 and 7, and a DC current is detected by current detector 8. When an overcurrent is produced, drive controller 9 detects output levels from these current detectors and turns off a drive signal, thereby shutting off the overcurrent to perform a protection operation.

Referring to FIG. 1, if a short-circuit occurs in a load terminal, a current flows from the DC power source (1 to 3) to load 5 through the MCTs and the IGBTs. A failure current is suppressed by a transistor effect (constant-current characteristic) of the IGBT. When the suppressed overcurrent is detected by detector 8, the MCTs and the IGBTs are rapidly turned off by controller 9, the current can be interrupted below a maximum interrupting current of the MCT.

FIG. 8 is a block diagram showing a configuration of the drive controller in FIG. 1. FIGS. 9A to 9F are waveforms illustrating an operation of the drive controller in FIG. 8.

A load current, flowing through any arm of the IBGT/MCT pair in the inverter of FIG. 1, is detected as load current signal e8 by current transformer 8. When load current signal e8 exceeds predetermined overcurrent detection level IL1 shown in FIG. 9A, overcurrent detector 102 generates overcurrent signal e102 at time $t_{10}$ as shown in FIG. 9B.

Overcurent signal e102 is supplied to AND gates 104 and 105. PWM controller 103 supplies pulse-width modulation control signals PWM1 and PWM2, as shown in FIGS. 9C and 9D, to AND gates 104 and 105, respectively. Gate 104 supplies logical product e104 of signals e102 and PWM1 to gate circuit 106, and gate 105 supplies logical product e105 of signals e102 and PWM2 to gate circuit 107.

Then, circuit 106 supplies IGBT gate signal G41, as shown in FIG. 9E, to each of IGBT's 42-46, and circuit 107 supplies MCT gate signal G44, as shown in FIG. 9F, to each of MCT's 51-55. Thus, gate signals G41 and G44 becomes OFF signals at time $t_{10}$ at which an overcurrent is detected, and slightly after time $t_{10}$, both the IGBT and MCT in each arm of the inverter shown in FIG. 1 are turned OFF.

FIG. 10 is a block diagram showing a configuration of the drive controller in FIG. 1. FIGS. 11A to 11F are waveforms illustrating an operation of the drive controller in FIG. 10.

A load current is detected as load current signal e8 by current transformer 8. When load current signal e8 exceeds predetermined overcurrent detection level IL1 shown in FIG. 11A, overcurrent detector 102 generates overcurrent signal e102 at time $t_{10}$ as shown in FIG. 11B.

Overcurrent signal e102 is supplied to decayed gate voltage generator 108 and delay circuit 110. After elapsing a predetermined period of time (e.g., 0.3 to 0.5 μsec.) from time $t_{10}$, generator 108 generates step signal e108 having a predetermined signal level as shown at time $t_{12}$ in FIG. 11C. Meanwhile, after elapsing another predetermined period of time (e.g., 5 to 10 μsec.) from time $t_{10}$, circuit 110 generates delayed signal e110 as shown at time $t_{14}$ in FIG. 11D.

PWM controller 103 generates pulse-width modulation control signals PWM1 and PWM2, as shown in FIGS. 11E and 11F, respectively. Signals PWM1 and PWM2 are supplied to AND gates 104 and 105, respectively. Both gates 104 and 105 receives delayed signal e110 from delay circuit 110. Gate 104 supplies logical product e104 of signals PWM1 and e110 to gate circuit 106, and gate 105 supplies logical product e105 of signals e110 and PWM2 to gate circuit 107.

Gate circuit 106 receives step signal e108 from decayed gate voltage generator 108, and modulates the amplitude of IGBT gate signal G41 by signal e108. Then, circuit 106 supplies IGBT gate signal G41, having a waveform as shown in FIG. 11G, to each of IGBT's 42-46, and circuit 107 supplies MCT gate signal G44, as shown in FIG. 11H, to each of MCT's 51-55. (The amplitude of the IGBT gate signal may be decayed exponentially, as is shown by broken line G41* in FIG. 11G).

When gate signal G41 having a staircase waveform as shown in FIG. 11G is supplied to the IGBT, the collector current of the IGBT is reduced in response to the reduction in level of signal G41 at time $t_{12}$ in FIG. 11G, so that the load current is correspondingly reduced after time $t_{12}$ as shown in FIG. 11A. Thereafter, both the IGBT and MCT in each arm of the inverter shown in FIG. 1 are turned OFF at time $t_{14}$ at which the overcurrent is reduced by a certain amount from the peak value thereof.

Incidentally, the overcurrent, flowing through the collector-emitter path of the IGBT, can be detected by detecting the value of collector-emitter voltage $V_{CE}$ of each IGBT. Such an overcurrent detection using $V_{CE}$ can be used in place of overcurrent detector 102 in FIG. 8 or 10.

An example of the above overcurrent detection using $V_{CE}$ of IGBT is disclosed in U.S. Pat. No. 4,721,869 issued on Jan. 26, 1988. All disclosures of this U.S. Patent are incorporated in the specification of the present invention.

According to this embodiment, the low-loss characteristic (constant-voltage characteristic) of the MCT and the constant-current characteristic of the IGBT can be effectively used to improve an operation efficiency and interrupt an overcurrent caused by a load short-circuit or the like within a safe interrupting current of an MCT without using large equipment such as a reactor. Therefore, a compact and economical bridge type power converter can be obtained.

In addition, since the MCTs are arranged at the positive side of the DC bus, only one gate power source need be used for the MCTs. Similarly, since the IGBTs are arranged at the negative side of the DC bus, only one gate power source need be used for the IGBTs. Therefore, a very compact and economical bridge type power converter can be obtained.

Note that the positional relationship between the MCTs and the IGBTs shown in FIG. 1 can be reversed.

Although an inverter bridge in which the number of series-connected elements is two has been described, the number of series-connected elements or the arrangement of a bridge is not limited to such an inverter bridge. For instance, the present invention can be applied to the configurations as shown in FIGS. 16 to 18.

In addition, the element is not limited to the MCT and the IGBT. For example, a Field Electric Transistor (FET), Static Induced Transistor (SIT), Static Induced Thyristor (SITH), Gate Turn-Off Thyristor (GTO), and the like can be used for the above elements.

According to the present invention, since a switching element having a low-loss characteristic such as a thyristor can be used, a high-efficiency operation can be performed. In addition, since a switching element having a constant-current characteristic such as a transistor (IGBT) can be used, a failure current can be suppressed below a maximum allowable current of the switching element and safely interrupted without using a large capacity reactor nor a expensive high-speed diode.

Furthermore, MCTs are connected as switching elements having a low-loss characteristic to the positive side of a DC bus, and IGBTs are connected as switching elements having a constant-current characteristic to the negative side of the DC bus. Therefore, the size of a gate drive power source can be minimized to realize a compact and economical bridge type power converter.

Figure 12:
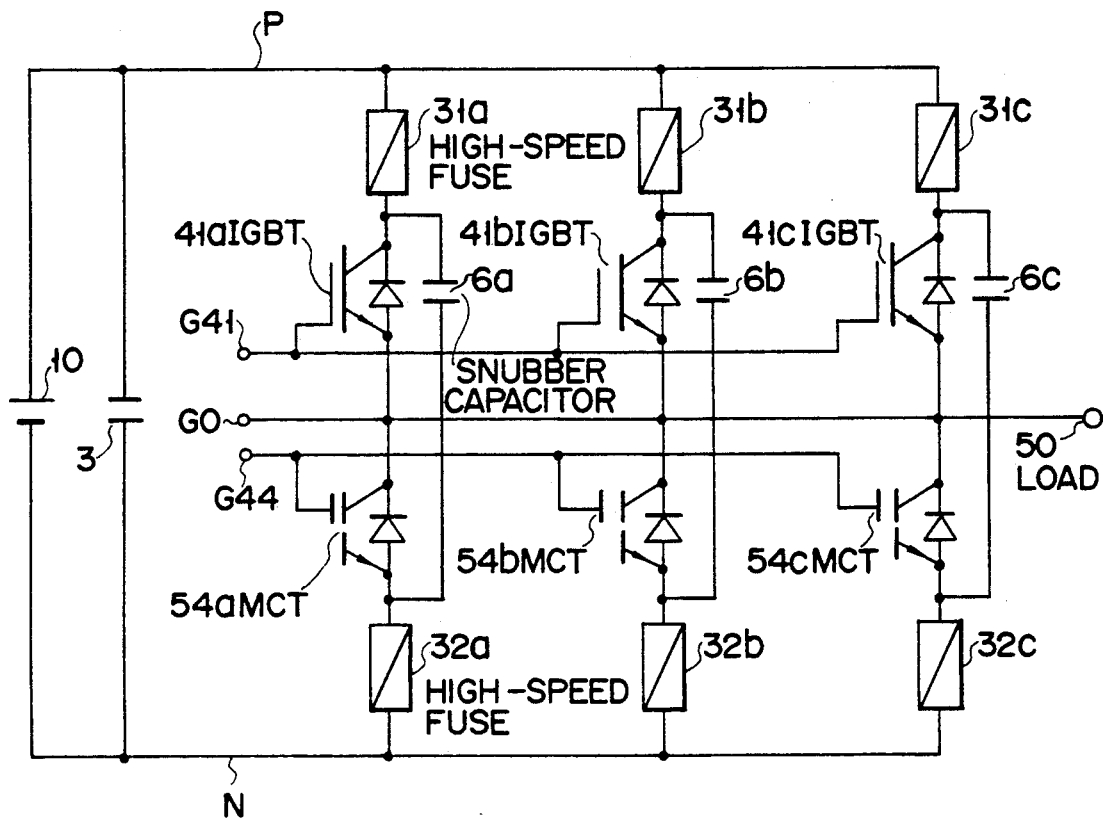
FIG. 12 is a circuit diagram of an inverter according to another embodiment of the preset invention.
Figure 13:
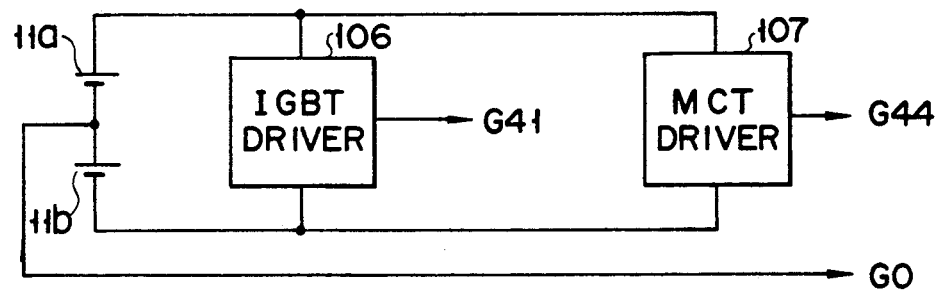
FIG. 13 shows IGBT/MCT drivers for the inverter in FIG. 12.

An arrangement of another embodiment of the present invention will be described below with reference to FIGS. 12 and 13. FIG. 12 shows one phase of an inverter bridge.

Positive side P of a DC bus of power supply 10 is connected to the collectors of IGBTs 41a, 41b, and 41c via fuses 31a, 31b, and 31c, respectively. The emitters of IGBTs 41a, 41b, and 41c are connected in parallel with each other and connected to parallel-connected anodes of MCTs 54a, 54b, and 54c to form output terminal G0 of the bridge.

The cathodes of MCTs 54a, 54b, and 54c are connected to negative side N of the DC bus, via fuses 32a, 32b, and 32c, respectively. The gates of IGBTs 41a, 41b, and 41c are connected in parallel to terminal G41, and the gates of MCTs 54a, 54b, and 54c are connected in parallel to terminal G44.

Snubber capacitor 6a is connected between the collector of IGBT 41a and the cathode of MCT 54a. Snubber capacitor 6b is connected between the collector of IGBT 41b and the cathode of MCT 54b. Snubber capacitor 6c is connected between the collector of IGBT 41c and the cathode of MCT 54c.

As shown in FIG. 12, a gate drive signal is supplied to gate G41 of the IGBTs, via intermediate point G0 between driver power sources 11a and 11b and IGBT driver 106, and is supplied to gate G44 of the MCTs, via intermediate point G0 and MCT driver 107. Common point G0 of a gate signal is common to the IGBTs and the MCTs.

When a negative gate signal is applied between the gate (G) and the anode (A) of MCT 54a, the ON FET is turned on, and an NPN transistor constituting the MCT is then turned on to flow a base current to a PNP transistor, thereby turning on the PNP transistor. As a result, the two transistors of the MCT operate as a thyristor. In order to turn off the MCT, a positive gate voltage is applied to gate G. As a result, since an OFF FET is turned on to short-circuit the base and the emitter of the PNP transistor, the PNP transistor is turned off, and the NPN transistor is turned off.

Figure 14:
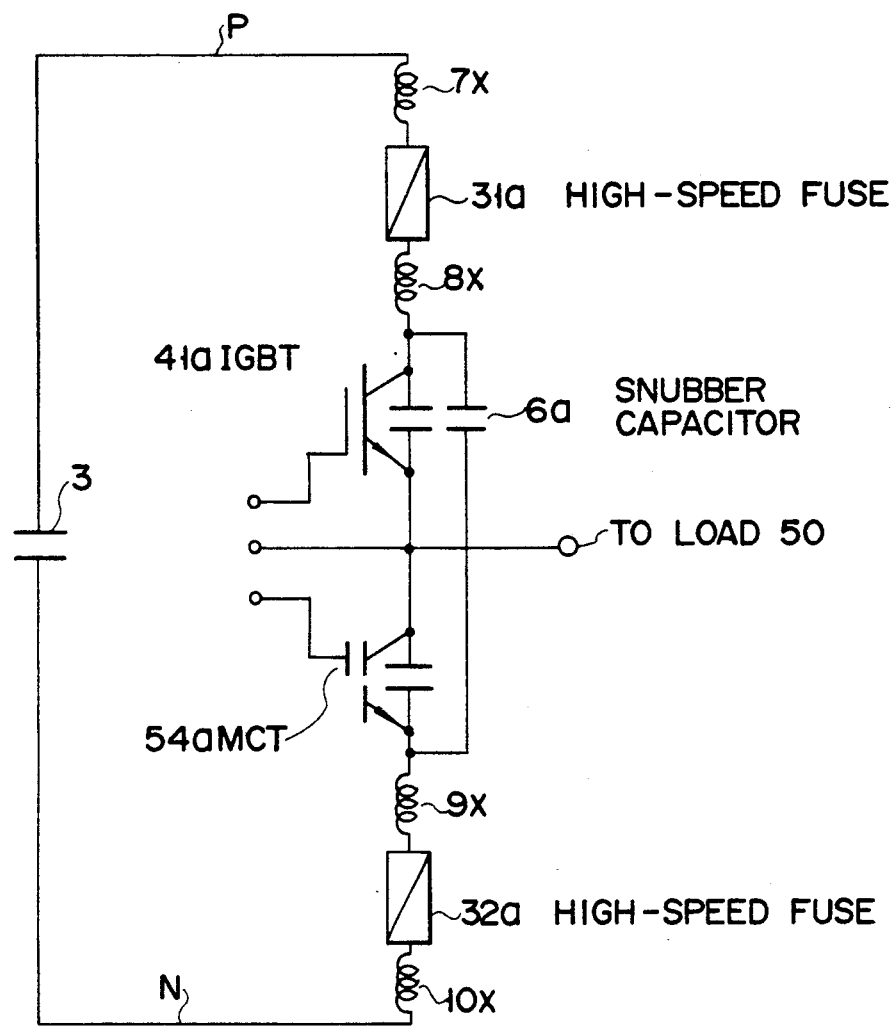
FIG. 14 shows an equivalent circuit of a part of the inverter in FIG. 12.

As shown in FIG. 14, energies of stray inductances 7 and 8 produced by mounting fuse 31a and stray inductances 9 and 10 produced by mounting fuse 32a are absorbed by capacitor 6a. Therefore, the IGBTs and the MCTs can be turned on/off without being adversely affected by an increase in inductances produced upon mounting of the fuses. In addition, since the capacitance of the capacitor 6a is small, even if the element is short-circuited, its discharge energy is so small as not to break the outer wall of the element.

Figure 15:
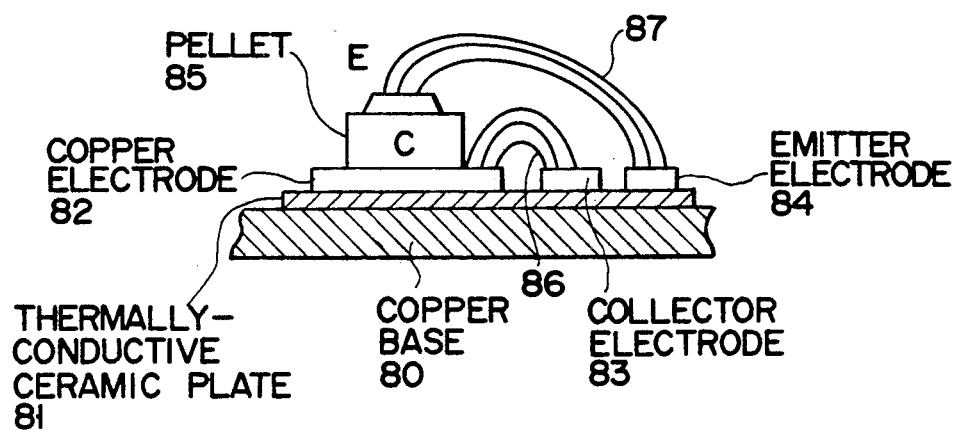
FIG. 15 is a sectional view of a transistor module containing an IGBT.

FIG. 15 shows a practical structure of a module transistor. Referring to FIG. 15, thermally-conductive ceramic plate 81 is adhered on copper base 80 for causing a cooling fin to radiate heat, and copper electrode 82, collector electrode 83, and emitter electrode 84 are adhered on ceramic plate 81. Pellet 85 of the transistor has a collector adhered on copper electrode 82 and an emitter terminal adhered thereon which is connected to emitter electrode 84 through bonding wire 87. Bonding wire 86 is connected to collector electrode 83 and extracted as a collector.

With this arrangement, since a cooling efficiency of bonding wire 86 is high while that of bonding wire 87 is low, bonding wire 87 is always fused before bonding wire 86.

A failure current must be interrupted by a high-speed fuse before this fusing.

In addition, as shown in FIG. 12, since both a gate signal for IGBTs 41a, 41b, and 41c and that for MCTs 54a, 54b, and 54c can be supplied by using signal line G0, drive power sources 11a and 11b can be commonly used for both the IGBTs and MCTs.

As described above, according to this embodiment, since the gate drive power source can be commonly used for both the upper and lower elements of the bridge, a compact and economical bridge can be provided.

In addition, since surge energies caused by stray inductances increased by mounting fuses can be absorbed by the snubber circuits provided in a DC portion on the element side, the surge voltage can be suppressed. Therefore, a semiconductor element bridge circuit having high safety and high efficiency can be provided.

Although a combination of IGBTs and MCTs is used in the arrangement shown in FIG. 12, if a complimentary P channel of an IGBT is completed (currently, a P channel has only a narrow operation range and therefore has not been put into practice yet), the present invention can be realized by using only IGBTs. In addition, the same effect can be obtained by another combination of elements to be developed in future.

FIG. 20 shows a circuit of one phase of an inverter constituted by a P/N complementary IGBTs. Gate signals supplied to P/N IGBTs in FIG. 20 may have waveforms as shown in FIG. 21A and 21B. In FIGS. 21A and 21B, periods Tx1 and Tx2 is provided to prevent simultaneous turning on of the two P/N IGBTs.

Furthermore, the snubber circuit can adopt various types of combinations of, e.g., diodes, capacitors, and resistors, as shown in FIGS. 22A to 22C.

Moreover, a single fuse may be inserted for a plurality of elements, as shown in FIG. 19.

As has been described above, according to the present invention, a fuse is connected in series with an element to prevent a rupture of the outer wall of the element. In addition, a switching energy caused by an increase in inductance produced by connecting the fuse is absorbed by the snubber circuit provided to an element side DC terminal of the bridge, thereby giving a margin to a safe operation region of the switching element. Therefore, reliability of the bridge can be improved, and its efficiency can be increased because a switching loss is reduced.

Furthermore, a common drive power source can be used for both the upper and lower elements of the bridge, a compact and economical semiconductor switching element bridge circuit can be provided.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A bridge type power converter comprising:
    a first switching element being provided with first and second terminals, and having a low conductive resistance but no current limiting characteristic;
    a second switching element being provided with first and second terminals, and having substantially a constant current characteristic;
    a third switching element being provided with first and second terminals, and having a low conductive resistance but no current limiting characteristic;
    a fourth switching element being provided with first and second terminals, and having substantially a constant current characteristic;
    a pair of DC lines formed of a first line and a second line, said first line being connected to the first terminals of said first and third switching elements, and said second line being connected to the second terminals of said second and fourth switching element;
    a load circuit having first and second nodes, one of which is connected to the second terminal of said first switching element and to the first terminal of said second switching element, and the other of which is connected to the second terminal of said third switching element and to the first terminal of said fourth switching element; and
    means for controlling ON/OFF states of said first to fourth switching elements.

2. A power converter according to claim 1, wherein said controlling means includes:
    means for detecting information of a current flowing through one of said first and second switching elements and through one of said second and fourth switching elements, and providing a first signal;
    means for comparing a level of said first signal with a predetermined level which represents an overcurrent for any of said first to fourth switching elements, and generating a second signal when the level of said first signal exceeds said predetermined level; and
    means, responsive to said second signal, for compulsorily turning-off at least two of said first to fourth switching elements through which the overcurrent corresponding to said predetermined level flows.

3. A power converter according to claim 1, wherein said controlling means includes:
    means for commonly controlling the ON/OFF states of said first and third switching elements; and
    means for commonly controlling the ON/OFF states of said second and fourth switching elements.

4. A power converter according to claim 1, further comprising:
    first overcurrent preventing means, inserted between the first line of said DC lines and the first terminal of said first and third switching elements, for preventing the overcurrent from being flowing into said first and third switching elements; and
    second overcurrent preventing means, inserted between the second line of said DC lines and the second terminal of said second and fourth switching elements, for preventing the overcurrent from being flowing into said second and fourth switching elements.

5. A power converter according to claim 4, further comprising:
    a snubber circuit having first and second ends, said first end being connected to a junction between said first overcurrent preventing means and the first terminal of said first and third switching elements, and said second end being connected to a junction between said second overcurrent preventing means and the second terminal of said second and fourth switching elements.

6. A power converter according to claim 1, further comprising:
    first overcurrent preventing means, inserted between the first line of said DC lines and the first terminal of said first switching element, for preventing the overcurrent form being flowing into said first switching element; and
    second overcurrent preventing means, inserted between the second line of said DC lines and the second terminal of said second switching element, for preventing the overcurrent from being flowing into said second switching element.

7. A power converter according to claim 6, further comprising:
    a snubber circuit having first and second ends, said first end being connected to a junction between said first overcurrent preventing means and the first terminal of said first switching element, and said second end being connected to a junction between said second overcurrent preventing means and the second terminal of said second switching element.

8. A power converter according to claim 1, wherein said controlling means includes:

means for detecting information of a current flowing through said load circuit to generate a first signal;

means for comparing a level of said first signal with a given overcurrent detection level to generate a second signal when the level of said first signal reaches said overcurrent detection level;

means for generating a first ON/OFF control signal and a second ON/OFF control signal;

first gate means for passing said first ON/OFF control signal to provide a third signal when said second signal is generated;

second gate means for passing said second ON/OFF control signal to provide a fourth signal when said second signal is generated;

first drive means for driving said second and fourth switching elements in response to said third signal, so that said second and fourth switching elements is ON/OFF controlled; and second drive means for driving said first and third switching elements in response to said fourth signal, so that said first and third switching elements is ON/OFF controlled.

9. A power converter according to claim 1, wherein said controlling means includes:

means for detecting information of a current flowing through said load circuit to generate a first signal;

means for comparing a level of said first signal with a given overcurrent detection level to generate a second signal when the level of said first signal reaches said overcurrent detection level;

means for generating a first ON/OFF control signal and a second ON/OFF control signal;

means for delaying said second signal by a predetermined period of time to provide a delayed signal;

first gate means for passing said first ON/OFF control signal to provide a third signal when said delayed signal is provided;

second gate means for passing said second ON/OF control signal to provide a fourth signal when said delayed signal is provided;

first drive means for driving said second and fourth switching elements in response to said third signal, so that said second and fourth switching elements is ON/OFF controlled;

second drive means for driving said first and third switching elements in response to said fourth signal, so that said first and third switching elements is ON/OFF controlled; and means for decaying a magnitude of driving said second and fourth switching elements in response to said second signal.

10. A power converter according to claim 1, wherein each of said first and third switching elements includes a MOS Controlled Thyristor, and each of said second and fourth switching elements includes an Insulated Gate Bipolar Transistor.

11. A bridge type power converter comprising:

a first self-extinguishing switching element having a low-loss characteristic with a small voltage drop in a conduction state, wherein said first self-extinguishing switching element is used in a DC positive side of a bridge of the power converter and comprises an MOS controlled thyristor driven by a signal applied between a terminal for receiving a main current of the power converter and a control terminal of the MOS controlled thyristor; and a second self-extinguishing switching element, connected in series to said first self-extinguishing switching element, and having a constant-current characteristic with a current to be suppressed in accordance with a drive signal, wherein said second self-extinguishing switching element is used in a DC negative side of the bridge and comprises an insulated gate bipolar transistor driven by a signal applied between a terminal for outputting the main current and a control terminal of the insulated gate bipolar transistor.

* * * * *